(12) United States Patent
Hung et al.

(10) Patent No.: US 8,258,774 B2
(45) Date of Patent: Sep. 4, 2012

(54) SYSTEM AND METHOD FOR IMPLEMENTING LOW-COST ELECTRONIC GYROSCOPES AND ACCELEROMETER

(75) Inventors: Chih-Ming Hung, McKinney, TX (US); Marco Corsi, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 440 days.

(21) Appl. No.: 12/613,049

(22) Filed: Nov. 5, 2009

(65) Prior Publication Data

US 2011/0101955 A1  May 5, 2011

(51) Int. Cl.
*G01R 23/12* (2006.01)
*G01P 15/00* (2006.01)

(52) U.S. Cl. .................. 324/76.53; 324/76.52; 702/141

(58) Field of Classification Search .............. 324/76.53, 324/76.52; 702/141
See application file for complete search history.

(56) References Cited

U.S. PATENT DOCUMENTS

| | | | |
|---|---|---|---|
| 3,861,220 A | 1/1975 | Felsenthal, Jr. | |
| 4,699,005 A | 10/1987 | Okabe | |
| 5,383,362 A | 1/1995 | Putty et al. | |
| 5,450,197 A | 9/1995 | Karpinski, Jr. | |
| 6,672,159 B2 | 1/2004 | Schmid et al. | |
| 6,912,475 B2 | 6/2005 | Moriya et al. | |
| 6,934,665 B2 | 8/2005 | Rober | |
| 6,937,342 B2 | 8/2005 | Osinski et al. | |
| 6,937,432 B2 | 8/2005 | Sri-Jayantha et al. | |
| 7,030,370 B1 | 4/2006 | Crookston | |
| 2006/0105733 A1 | 5/2006 | Singh et al. | |

FOREIGN PATENT DOCUMENTS

| | | |
|---|---|---|
| EP | 0254221 | 1/1988 |
| WO | WO 2004/008071 | 1/2004 |

OTHER PUBLICATIONS

"Large S-Section-Ring-Cavity Diode Lasers: Directional Switching, Electrical Diagnostics, and Mode Beating Spectra," IEEE Photonics Technology Letters, vol. 17, No. 2, Feb. 2005, pp. 282-284 (Hongjun Cao, Hai Ling, Chiyu Liu, Hui Deng, Marcita Benavidez, Vladimir A. Smagley, Robert B. Caldwell, Gregory M. Peake, Gennady A. Smolyakov, Petr G. Eliseev and Marek Osinski).
PCT Search Report mailed Jun. 21, 2011, for international application No. PCT/US2010/055350.

*Primary Examiner* — Amy He
(74) *Attorney, Agent, or Firm* — John J. Patti; Wade J. Brady, III; Frederick J. Telecky, Jr.

(57) ABSTRACT

Accelerometers have a number of wide-ranging uses, and it is desirable to both increase their accuracy while decreasing size. Here, millimeter or sub-millimeter wavelength accelerometers are provided which has the advantage of having the high accuracy of an optical accelerometer, while being compact. Additionally, because millimeter or sub-millimeter wavelength signals are employed, cumbersome and awkward on-chip optical devices and bulky optical mediums can be avoided.

8 Claims, 7 Drawing Sheets

SYSTEM AND METHOD FOR IMPLEMENTING LOW-COST ELECTRONIC GYROSCOPES AND ACCELEROMETER

TECHNICAL FIELD

The invention relates generally to a gyroscope or accelerometer and, more particularly, to a millimeter and submillimeter wavelength, electronically controlled accelerometer or gyroscope.

BACKGROUND

Gyroscopes and accelerometers have been used in many devices over the years, and numerous types, of varying technologies, have been developed. The two most advanced technologies believed to exist are laser based and microelectromechanical systems (MEMS) based. Each of these different technologies, though, has limitations.

An example of a laser based accelerometer is described in U.S. Pat. No. 6,937,432 ("432 patent"). The '432 patent describes a monolithically integrated ring laser gyroscope. Specifically, the light (beams) from two ring lasers is combined through optical couplers so that an interaction of the beams with a photodetector. A problem with this accelerometer is that it is an optical system that requires optical elements to be formed on an integrated circuit (IC) with lasers, photodetectors, and other electronics. Thus, this type of accelerometer can be difficult and expensive to manufacture.

Some other examples of conventional accelerometers are: European Patent No. EP10254221; U.S. Pat. No. 7,030,370; U.S. Pat. No. 4,699,005; U.S. Pat. No. 3,861,220; U.S. Pat. No. 5,383,362; U.S. Pat. No. 5,450,197; U.S. Pat. No. 6,937,342; U.S. Patent Pre-Grant Publ. No. 2006/0105733; and Cao et al., "Large S-Section-Ring-Cavity Diode Lasers: Directional Switching, Electrical Diagnostics, and Mode Beating Spectra" IEEE Photonics Technology Letters, Vol. 17, No. 2, February 2005, pp. 282-284.

SUMMARY

A preferred embodiment of the present invention, accordingly, provides an apparatus. The apparatus comprises a substrate; a phase locked loop (PLL) formed on the substrate, wherein the PLL generates an input signal having a wavelength that is less than 10 mm and greater than 100 µm; a first propagation path section, formed on the substrate, having a first length, wherein the PLL is coupled to the first propagation path section; a second propagation path section, formed on the substrate, that is coupled to the first propagation path section, wherein the second propagation path section has a shape; a third propagation path section, formed on the substrate, that is coupled to the first and second propagation path sections, wherein the third propagation path section has a first length; fourth propagation path section, formed on the substrate, that is coupled to the second propagation path section, wherein the fourth propagation path section has a second length; and detection circuitry that is coupled to the third and fourth propagation path sections, wherein the first and second lengths are selected such that, when the apparatus is at rest, output signals from the third and fourth propagation path sections are substantially in phase.

In accordance with a preferred embodiment of the present invention, the combined length of the second and fourth propagation path sections is approximately equal to a rational number multiple of the wavelength of the input signal.

In accordance with a preferred embodiment of the present invention, the combined length of the first and third propagation path sections is approximately equal to the second length.

In accordance with a preferred embodiment of the present invention, the shape is generally circular.

In accordance with a preferred embodiment of the present invention, the shape is generally an equilateral triangle.

In accordance with a preferred embodiment of the present invention, the detection circuitry further comprises a phase detector.

In accordance with a preferred embodiment of the present invention, the phase detector further comprises a time amplifier.

In accordance with a preferred embodiment of the present invention, the propagation path is a waveguide.

In accordance with a preferred embodiment of the present invention, the propagation path is a trace.

In accordance with a preferred embodiment of the present invention, the detection circuitry further comprises: a first divider that is coupled to the PLL; a second divider that is coupled to the fourth propagation path section; a phase detector that is coupled to each of the first and second dividers; and output circuitry that is coupled to the phase detector.

In accordance with a preferred embodiment of the present invention, an apparatus is provided. The apparatus comprises a substrate; a first propagation path have a first shape formed on the substrate; a second propagation path having a second shape formed on the substrate, wherein the second shape is substantially the same as the first shape; an oscillator that is coupled to the first propagation path and the second propagation path and applies a first signal to the first propagation path and a second signal to the second propagation path, wherein the wavelength of the first signal is less than 10 mm, and wherein the wavelength of the first signal is greater than 100 µm, and wherein the wavelength of the second signal is approximately equal to the wavelength of the first signal; a PLL that is coupled to the first propagation path, the second propagation path, and the oscillator; and detection circuitry that is coupled to each of the first and second PLLs, wherein detection circuitry measures the phase difference between the first and second signals to determine physical movement.

In accordance with a preferred embodiment of the present invention, the oscillator further comprises: a first oscillator that is coupled to the first propagation path and applies the first signal to the first propagation path; and a second oscillator that is coupled to the second propagation path and that applies the second signal to the second propagation path.

In accordance with a preferred embodiment of the present invention, the PLL further comprises: a first PLL that is coupled to the first propagation path and the first oscillator; and a second PLL that is coupled to the second oscillator and the second propagation path.

In accordance with a preferred embodiment of the present invention, the first and second propagation paths further comprises first and second traces.

In accordance with a preferred embodiment of the present invention, the first and second propagation paths further comprises first and second waveguides.

In accordance with a preferred embodiment of the present invention, the detection circuitry further comprises: a first divider that is coupled to the first PLL; a second divider that is coupled to the second PLL; a phase detector that is coupled to each of the first and second dividers; and output circuitry that is coupled to the phase detector.

In accordance with a preferred embodiment of the present invention, the first and second propagation paths are generally circular in shape.

In accordance with a preferred embodiment of the present invention, the first and second propagation paths are generally triangular in shape.

In accordance with a preferred embodiment of the present invention, an apparatus is provided. The apparatus comprises a housing; a plurality of reflectors that are each secured to the housing, wherein the reflectors are substantially reflective to radiation having a wavelength that is less than 10 mm and greater than 100 µm, and wherein the reflectors are arranged to form a form a propagation path; and an integrated circuit (IC) that is secured to the housing and located in the propagation path, wherein the IC includes: a first antenna that is coupled to the propagation path; a second antenna that is coupled to the propagation path; a third antenna that is coupled to the propagation path; a fourth antenna that is coupled to the propagation path; an first oscillator that is coupled to the first antenna and applies a first signal to the propagation path traveling in a first direction, wherein the wavelength of the first signal is less than 10 mm and greater than 100 µm; an second oscillator that is coupled to the third antenna and applies a second signal to the propagation path traveling in a second direction, wherein the wavelength of the second signal is less than 10 mm and greater than 100 µm; a first PLL that is coupled to the second antenna and the first oscillator; a second PLL that is coupled to the fourth antenna and the second oscillator; and detection circuitry that is coupled to each of the first and second PLLs, wherein detection circuitry measures the phase difference between the first and second signals to determine physical movement.

In accordance with a preferred embodiment of the present invention, the first and second PLLs are open loop and the received signals from the second and the forth antennas are provided to the detection circuitry.

In accordance with a preferred embodiment of the present invention, the reflectors are comprised of a conductive material.

In accordance with a preferred embodiment of the present invention, the reflectors are comprised of aluminum.

In accordance with a preferred embodiment of the present invention, the detection circuitry further comprises: a first divider that is coupled to the first PLL; a second divider that is coupled to the second PLL; a phase detector that is coupled to each of the first and second dividers; and output circuitry that is coupled to the phase detector.

In accordance with a preferred embodiment of the present invention, the propagation path is generally triangular in shape.

In accordance with a preferred embodiment of the present invention, the IC further comprises: a first coupler that optically couples the first and fourth antennas to the propagation path; and a second coupler that optically couples the second and third antennas to the propagation path.

In accordance with a preferred embodiment of the present invention, the first and second signals have approximately the same wavelength, and wherein each of the first and second signals includes coding so as to reduce interference.

In accordance with a preferred embodiment of the present invention, an apparatus is provided. The apparatus comprises a housing; a plurality of reflectors that are each secured to the housing, wherein the reflectors are substantially reflective to radiation having a wavelength that is less than 10 mm and greater than 100 µm, and wherein the reflectors are arranged to form a form a first propagation path section; and an integrated circuit (IC) that is secured to the housing and located in the first propagation path section, wherein the IC includes: a PLL that generates an input signal having a wavelength that is less than 10 mm and greater than 100 µm; a first antenna that is coupled to the PLL; a second propagation path section having a first length, wherein the first antenna is coupled to the second propagation path section so that at least a portion of the input signal traverses the second propagation path, and wherein the first propagation path section is coupled to the second propagation section; a third propagation path section having a second length, wherein at least a portion of the input signal traverses the third propagation path section; a second antenna that is coupled to the third propagation path section; a fourth propagation path section having a third length, wherein the fourth propagation path section is coupled to the first propagation path section; a third antenna that is coupled to the fourth propagation path section; and detection circuitry that is coupled to the second and third antennas, wherein the first, second, and third lengths are selected such that, when the apparatus is at rest, output signals from the second and third antennas are substantially in phase.

In accordance with a preferred embodiment of the present invention, the IC further comprises a beamsplitter that is coupled between the first, second, and third propagation path sections.

In accordance with a preferred embodiment of the present invention, the beamsplitter is comprised of silicon.

In accordance with a preferred embodiment of the present invention, the combined first and second lengths is approximately equal to the third length.

In accordance with a preferred embodiment of the present invention, the detection circuitry further comprises: a first divider that is coupled to the second antenna; a second divider that is coupled to the third antenna; a phase detector that is coupled to each of the first and second dividers; and output circuitry that is coupled to the phase detector.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1A:
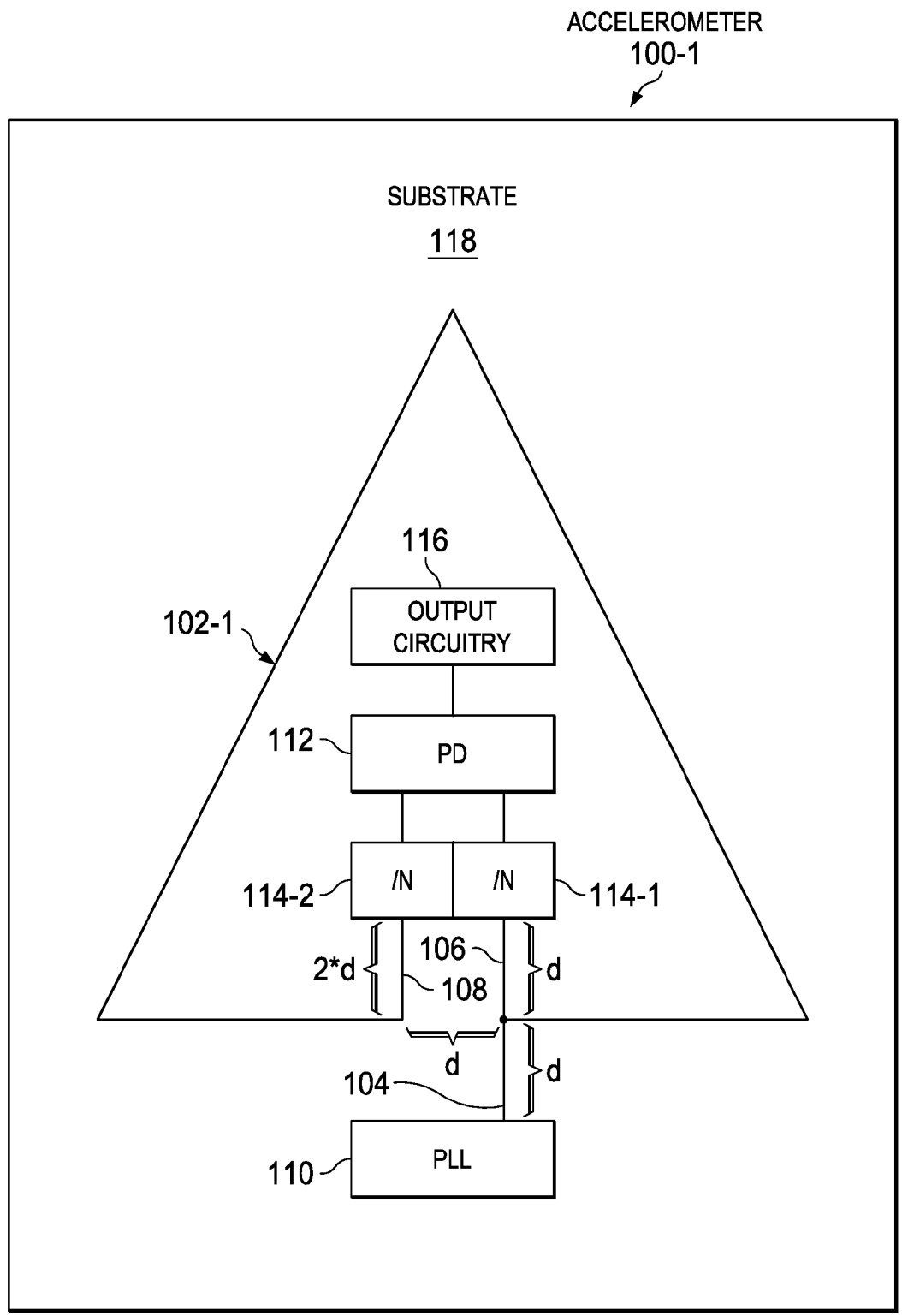
FIGS. 1A and 1B are examples of an integrated circuit having an accelerometer with a single propagation path in accordance with a preferred embodiment of the present invention.

Refer now to the drawings wherein depicted elements are, for the sake of clarity, not necessarily shown to scale and wherein like or similar elements are designated by the same reference numeral through the several views.

Figure 1B:
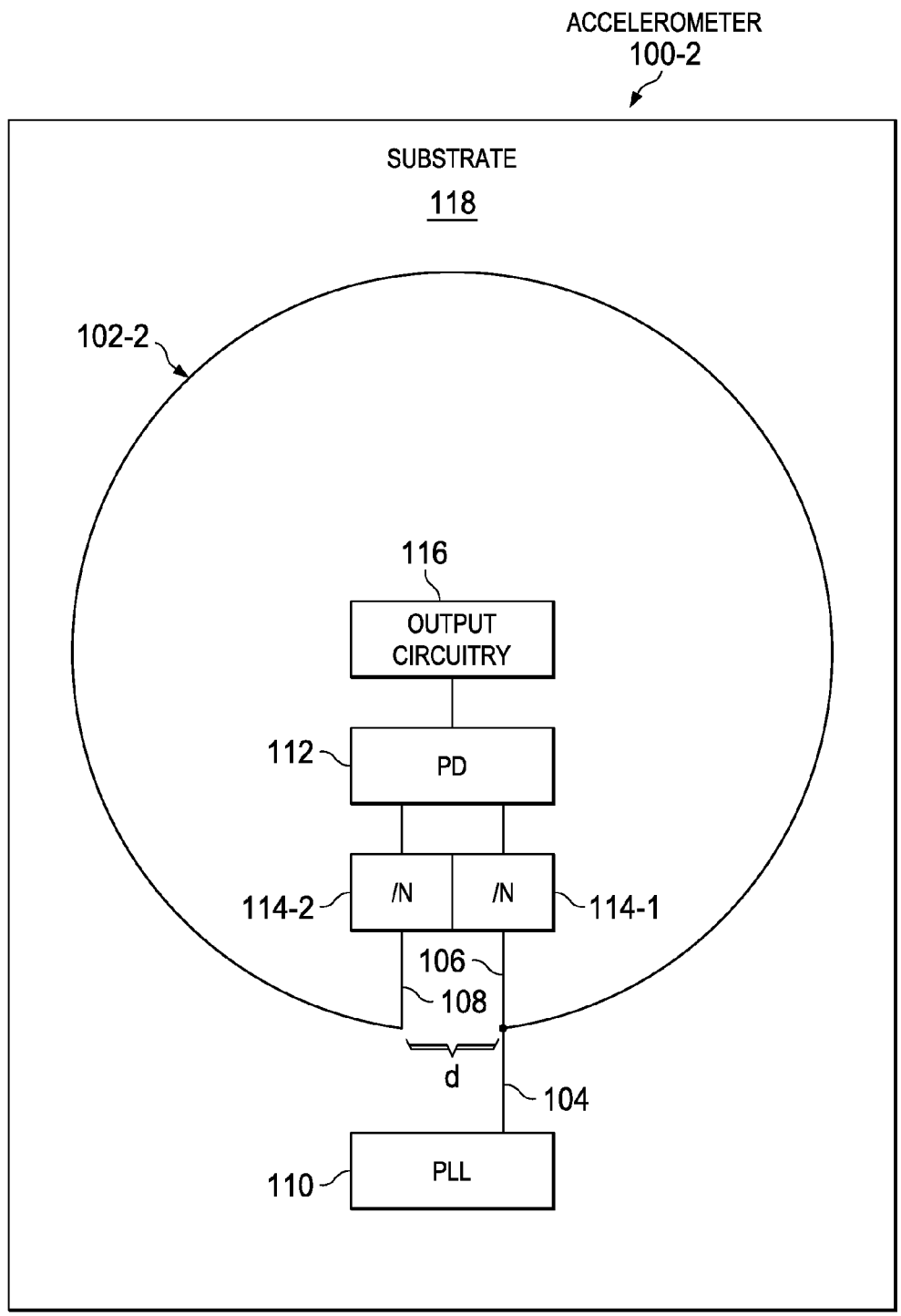

Referring to FIGS. 1A and 1B of the drawings, the reference numerals 100-1 and 100-2 generally designate accelerometers in accordance with the preferred embodiment of the present invention. These accelerometers 100-1 and 100-2 are generally described as being "on-chip" or a monolithically integrated onto a single integrated circuit (IC), which can be produced using conventional CMOS, BiCMOS, or compound semiconductor processes. Each of the accelerometers 100-1 and 100-2 generally comprise a phase locked loop (PLL) 110, a phase detector (PD) 112, propagation path sections 104, 106, and 108, dividers 114-1 and 114-2, and output circuitry 116, which are all formed on a substrate 118. A difference between accelerometers 100-1 and 100-2 resides in the shape of the respective propagation paths 102-1 and 102-2, which are generally triangular and generally circular (respectively). It is possible to have a variety of different shapes, and the shapes of paths 102-1 and 102-2 are examples.

In each of FIGS. 1A and 1B, accelerometers 100-1 and 100-2, which are generally gyroscopes that detect rotation about the center of propagation paths 102-1 and 102-2, respectively. In these examples, a signal produced by the PLL 110, which has a wavelength that is less than about 10 mm and greater than about 100 μm or a frequency that is greater than about 30 GHz and less than about 3 THz. This signal propagates from the PLL 110 to the propagation path 102-1 or 102-2 and section 108 (having a predetermined length d) through section 104 (has a predetermined length d). After propagating through path 102-1, the signal propagates through section 108 (having a predetermined length 2d). Each of sections 106 and 108 are then coupled to PD 112, which can determine the phase/frequency difference between the signals from each of sections 106 and 108. The lengths of sections 106 and 108, though, are selected so that when the accelerometer 100-1 is at rest, the phases of the signals from the sections 106 and 108 are substantially the same. However, when there is rotation about the center of path 102-1 or 102-2, the propagation path length increases (or decreases depending on the direction of rotation). The difference between the phase/frequency of the signal output from section 106 (which is the reference signal) and the signal from section 108 provides a measurement for these rotations.

Turning first to FIG. 1A, the equations for a triangular path are as follows. Considering that path 102-1 is substantially an equilateral triangle, each side of the triangle has a length of L, so that for time for a signal to traverse the path 102-1 is about:

$$t = \frac{3L}{c} = \frac{S}{c} \quad (1)$$

Additionally, because path 102-1 is substantially an equilateral triangle, the distance (r) from the center of path 102-1 to one of its corners is:

$$r = \frac{L}{\sqrt{3}} \quad (2)$$

Now, if one chooses one point of the equilateral triangle to rotate about its center, the distance (k) that the point travels is $$k = r\omega t = r\omega \frac{S}{c} = \frac{L\omega S}{c\sqrt{3}}, \quad (3)$$

where ω is the rotational speed about the center of the equilateral triangle. As a result, the increase in distance (δS) that the signal travels (when rotating) is $$\delta S = k\cos\frac{\pi}{3} = \frac{k}{2} \quad (4)$$

Equation (3) can be substitute into equation (4) so that distance (δS) becomes:

$$\delta S = \frac{L\omega S}{2c\sqrt{3}} \quad (5)$$

Now assuming that the path length S (which is approximately equal to path 102-1 plus a portion of section 108) is:

$$S = n\lambda \Rightarrow n = \frac{S}{\lambda}, \quad (6)$$

which shows that:

$$\delta S = n\delta\lambda = \frac{S}{\lambda}\delta\lambda \Rightarrow \frac{\delta S}{S} = \frac{\delta\lambda}{\lambda} = \frac{\delta v}{v} \quad (7)$$

Now, solving equation (7) for the change in frequency (δv) and substituting equation (5), the change in frequency (δv) is $$\delta v = \frac{\delta S}{S}v = \frac{L\omega}{2c\sqrt{3}}v = \frac{n\lambda}{3} \cdot \frac{\omega}{2c\sqrt{3}}v = \frac{n\omega}{6\sqrt{3}} \quad (8)$$

Thus, it can be seen that the change is frequency is proportional to n or the number of wavelengths, so that when a path 102-1 can be made with a large n, there is a greater change in the frequency. Therefore, having an input signal with wavelength that is less than about 10 mm and greater than about 100 μm, one is able to produce an "on-chip" accelerometer. As an example, one can assume that the signal generated by the PLL 100 has a frequency of about 300 GHz and a wavelength of about 1 mm, while n is 3. The area of path 102-1 would be about 433,000 μm².

Turing to FIG. 1B, the equations for a triangular path are as follows. Considering that path 102-2 is substantially circular, time for a signal to traverse the path 102-2 is about:

$$t = \frac{2\pi r}{c} = \frac{S}{c} \quad (9)$$

Now, if one chooses one point of the circle to rotate about its center, the increase in distance (δS) that the signal travels (when rotating) is $$\delta S = r\omega t = r\omega \frac{S}{c} \quad (10)$$

Now assuming that the path length S (which is approximately equal to path 102-2 plus a portion of section 108) is:

$$S = 2\pi r = n\lambda \Rightarrow r = \frac{n\lambda}{2\pi} \quad (11)$$

Now, using the change in frequency ($\delta v$) from equation (7) and substituting equation (11), the change in frequency ($\delta v$) is $$\delta v = \frac{\delta S}{S} v = \frac{r\omega}{c} v = \frac{n\lambda}{2\pi} \cdot \frac{\omega}{c} v = \frac{n\omega}{2\pi} \quad (12)$$

Thus, it can be seen that the change is frequency is proportional to n or the number of wavelengths, so that when a path 102-2 can be made with a large n, there is a greater change in the frequency. Therefore, having an input signal with wavelength that is less than about 10 mm and greater than about 100 µm, one is able to produce an "on-chip" accelerometer. As an example, one can assume that the signal generated by the PLL 100 has a frequency of about 300 GHz and a wavelength of about 1 mm, while n is 2. The area of path 102-1 would be about 318,000 µm².

Figure 2A:
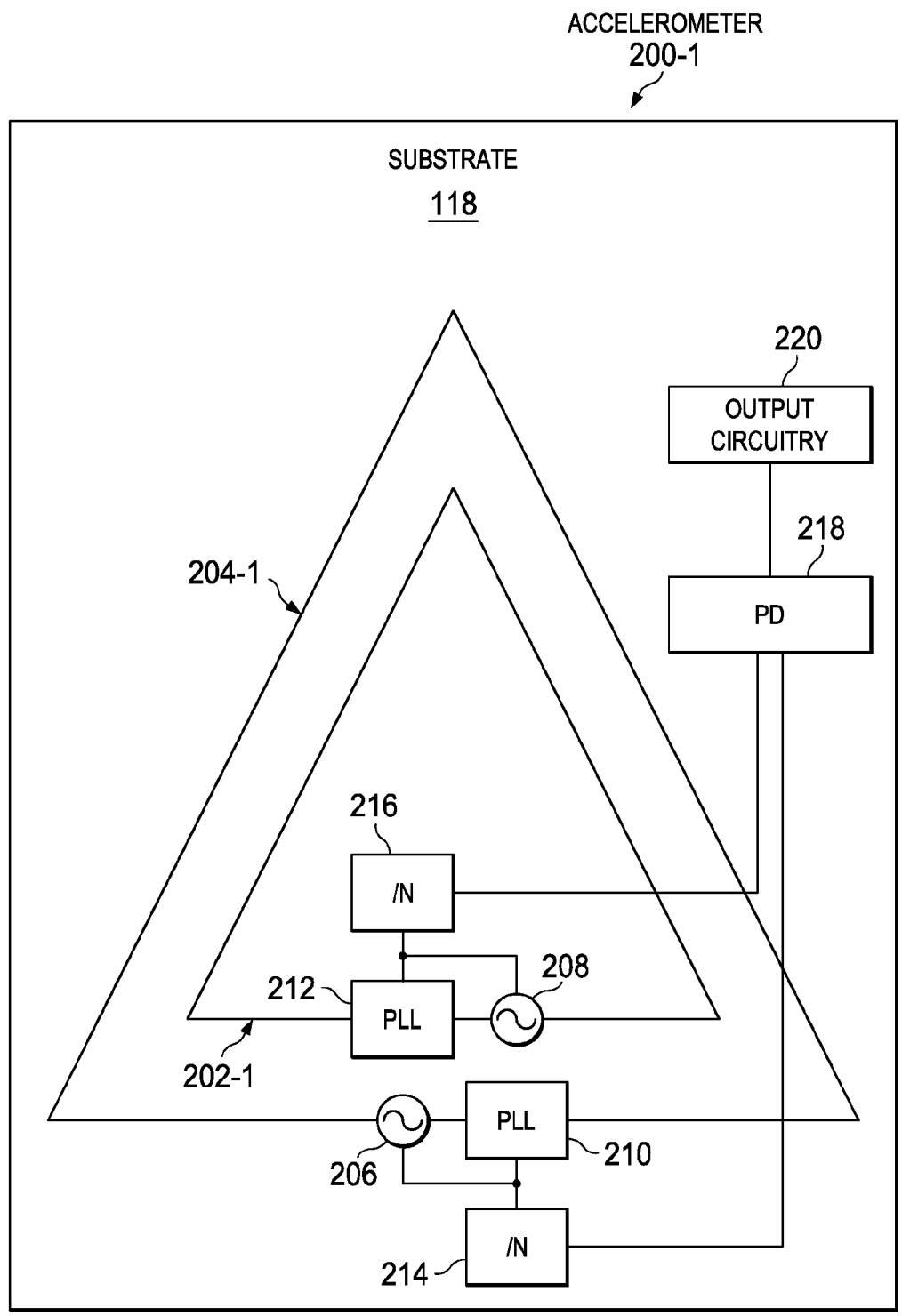
FIGS. 2A and 2B are examples of an integrated circuit having an accelerometer with multiple propagation paths in accordance with a preferred embodiment of the present invention.
Figure 2B:
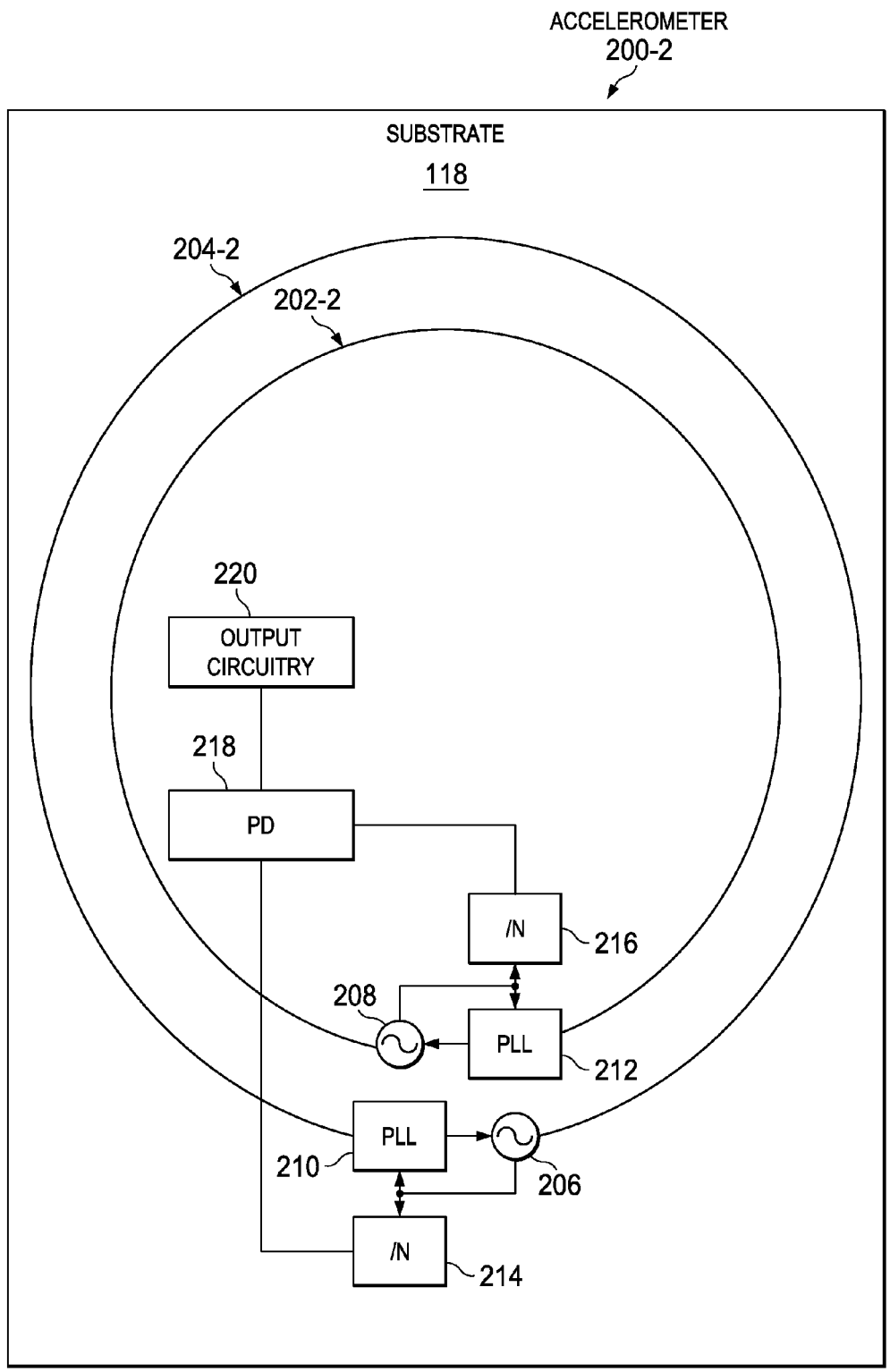

Turning now to FIGS. 2A and 2B, accelerometers 200-1 and 200-2 can be seen. Similar to accelerometers 100-1 and 100-2, accelerometers 200-1 and 200-2 are generally described as being "on-chip" or a monolithically integrated onto a single IC, which can be produced using conventional CMOS, BiCMOS or compound semiconductor processes. Each of the accelerometers 200-1 and 200-2 generally comprise oscillators 206 and 208, PLLs 212 and 210, PD 218, divider 214, and output circuitry 220, which are all formed on a substrate 118. A difference between accelerometers 200-1 and 200-2 resides in the shape of the respective propagation paths 202-1/204-2 and 202-2/204-2, which are generally triangular and generally circular (respectively). It is possible to have a variety of different shapes, and the shapes of paths 202-1/204-2 and 202-2/204-2 are examples. Additionally, even though propagation paths 202-1/204-2 and 202-2/204-2 are shown as being separated from one another, paths 202-1/204-2 and 202-2/204-2 may be coextensive. Moreover, a signal arrangement of an oscillator 206 and PLL 210 may also be employed for both paths 202-1/204-2 or 202-2/204-2.

In FIG. 2A, two separate triangular paths 202-1 and 204-1 are shown. The principle behind the operation of accelerometer 200-1 is similar to that of accelerometer 100-1, but signals (which may have the same or different frequencies) are propagated in opposite direction and use the Sagnac effect. Assuming that paths 202-1 and 204-1 are generally coextensive and that each of paths 202-1 and 204-1 are substantially equilateral triangles, each side of the triangle has a length of L, so that equations (1) through (5) apply to paths 202-1 and 204-2. Additionally, if the paths 202-1 and 204-1 are generally coextensive and the signals have the approximately the same frequency, coding within the signals may be used to avoid problems associated with interference. Because the area of the triangle is:

$$A = \frac{L^2 \sqrt{3}}{4}, \quad (13)$$

equation (10) becomes:

$$\delta S = \frac{L\omega S}{2c\sqrt{3}} = \frac{3\omega L^2}{2c\sqrt{3}} = \frac{\sqrt{3}\,\omega L^2}{2c} = \frac{2\omega A}{c}. \quad (14)$$

Since the two beams have the same frequency shift (but in opposite directions), the beat frequency (f) is:

$$f = 2\delta v = \frac{\delta S}{S} v = \frac{2\omega A}{Sc} v = \frac{2\omega A}{S\lambda}. \quad (15)$$

In FIG. 2B, two separate triangular paths 202-1 and 204-1 are shown. The principle behind the operation of accelerometer 200-1 is similar to that of accelerometer 100-1, but signals are propagated in opposite direction and use the Sagnac effect. Assuming that paths 202-1 and 204-1 are generally coextensive and that each of paths 202-1 and 204-1 are substantially circular, the time to travel paths 202-1 and 204-1 are:

$$t_\pm = \frac{2\pi r \pm r\omega t}{c}, \quad (16)$$

Solving for t, equation (16) becomes:

$$t_\pm = \frac{2\pi r}{c\left(1 \mp \frac{r\omega}{c}\right)}. \quad (17)$$

The time difference ($\Delta t$) is $$\Delta t = t_+ - t_- = \frac{4\pi r^2 \omega}{c^2} \frac{1}{1-\left(\frac{r^2\omega^2}{c^2}\right)} \approx \frac{4\pi r^2 \omega}{c^2} = \frac{2A\omega}{c^2} \quad (18)$$

Accordingly, $\delta S$ is $$\delta S = c\Delta t = \frac{2A\omega}{c} \quad (16)$$

Since the two beams have the same frequency shift (but in opposite directions), the beat frequency (f) is identical to equation (15).

Additionally, because of the unique characteristics of a millimeter and submillimeter wavelength radiation, an accelerometer 300 comprised of a combination of "on-chip" and "off-chip" components can also be built. While it is known to utilize "on-chip" and "off-chip" components to form accelerometers (such as fiber optic gyroscopes, which can be seen in FIG. 2 of European Patent No. EP1025422 with the signals propagate within the optical fiber which is a waveguide), such devices are usually very large. In the case of fiber optic gyroscopes, it is not uncommon to use several kilometers of tightly wound optical fiber, and with other ring laser gyroscopes, large quartz crystals are very often used. This is in stark contrast to accelerometer 300, where the signals propagate without an explicit waveguide, leading to a more compact and a lower-cost arrangement. Furthermore, fiber optic gyroscopes typically suffer from multi-mode optical locking, and it is not possible to utilize a PLL in the optical system to eliminate the multi-mode locking and to reduce the timing jitter for a higher accuracy in the accelerometer. The unique solid-state accelerometer 300, which utilizes PLLs and operates in millimeter and submillimeter wavelength, overcomes those deficiencies in fiber optic gyroscopes.

Figure 3A:
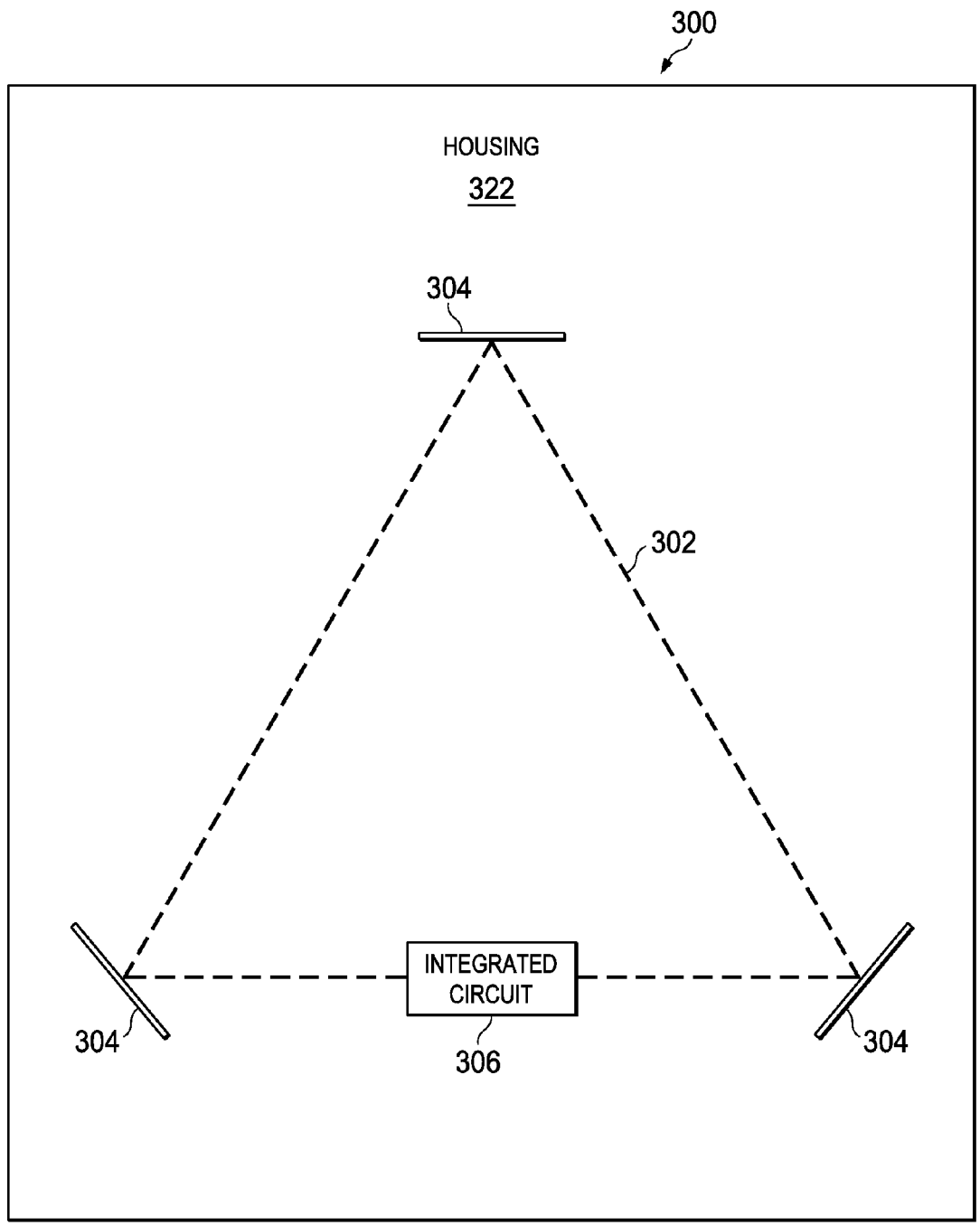
FIGS. 3A through 3C are examples of an accelerometer employing on-chip and off-chip components in accordance with a preferred embodiment of the present invention.

Accelerometer 300 employs a very simply, robust, and compact system that was not previously achievable. Essentially, reflectors 304 are secured to a housing 322 (such as a cell phone housing) to form an optical or propagation path 302. As shown in FIG. 3A, the optical or propagation path 302 is an equilateral triangle, with reflectors 304 secured at the vertices of the triangle, but other shapes are also available. Because millimeter and submillimeter wavelength radiation is employed, the reflectors 304 may be comprised of conductive materials (such as aluminum) without the need for glass or other materials usually present in optical systems. Integrated circuit (IC) 306 is also secured to the housing 322, located within the optical path 302, to determine motion.

Figure 3B:
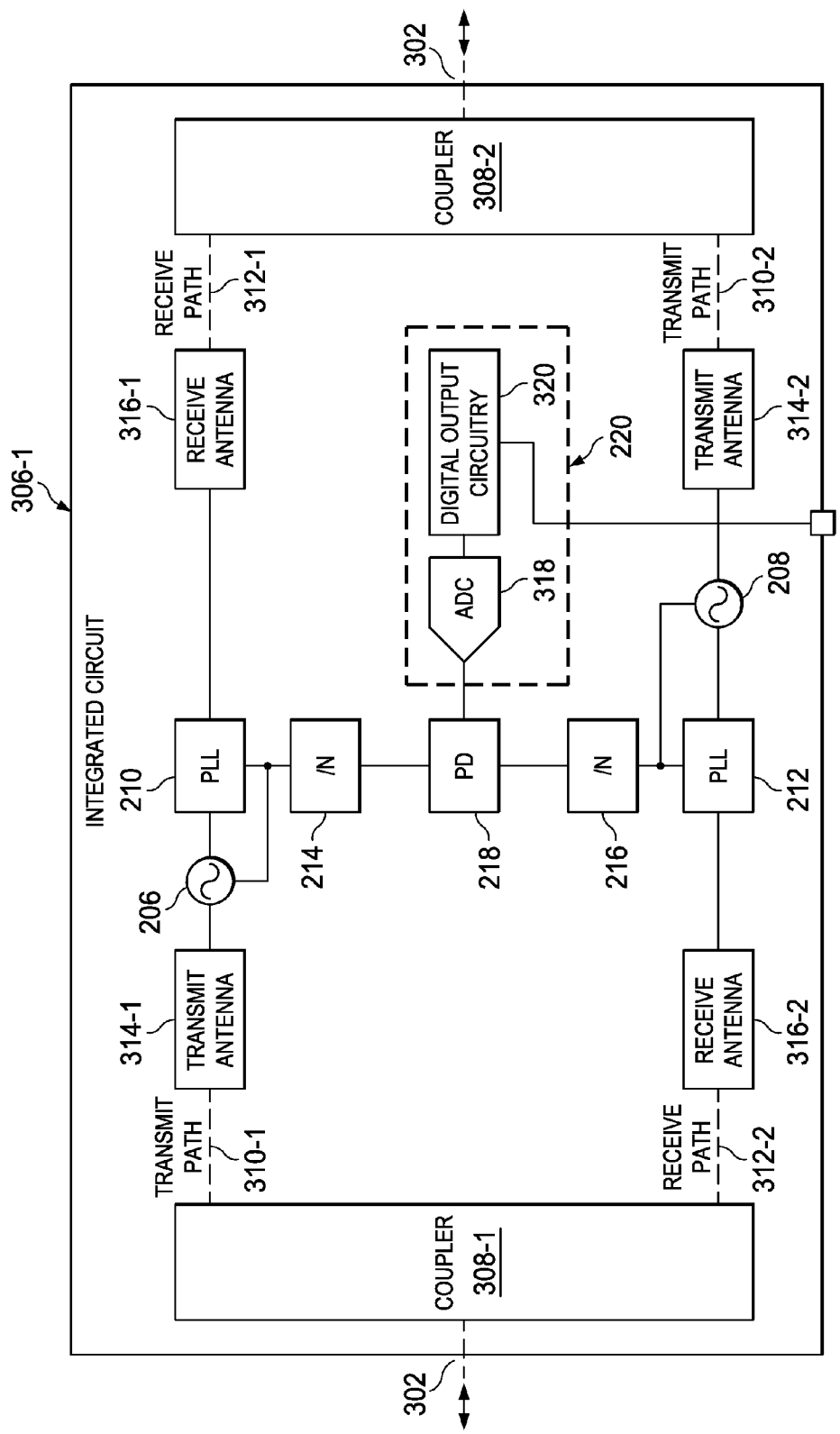

Turning to FIG. 3B, an example of IC 306 (denoted as reference numeral 306-1) that employs two separate beams or signals can be seen in greater detail. As shown, IC 306-1 generally uses the same or similar arrangement as shown in FIGS. 2A and 2B, namely, oscillators 206 and 208, PLLs 210 and 212, PD 218, dividers 214 and 216, and output circuitry 220 (which is shown as having an analog-to-digital/time-to-digital converter 318 and digital output circuitry 320). A difference, however, is that IC 306-1 employs transmission or TX antennas 314-1 and 314-2, receive or RX antennas 316-1 and 316-2, and (optional) optical couplers 308-1 and 308-2 (which enhance the optical properties of the radiated signals). The TX antennas 314-1 and 314-2 (which can be comprised of a variety of antennas such as microstrip patch antennas) generate first and second signals (traveling in opposite directions). Preferably, the first and second signals are different frequencies to reduce interference but can be the same frequency if coding is included in the signals. Each of these antennas 314-1 and 314-2 have good directional characteristics so as to allow the radiation to travel along TX paths 310-1 and 310-2 to couplers 308-1 and 308-2 so that the first and second signals can be enhanced to propagate along path 302. Additionally, the antennas 314-1 and 314-2 can be coupled directly to path 302. RX antennas 316-1 and 316-2 (which can also be comprised of a variety of antennas such as microstrip patch antennas) are also optically coupled to couplers 308-1 and 308-2 to complete the system so that a determination regarding motion can be made. The antennas 316-1 and 316-2 can also be coupled directly to path 302. Generally, couplers 308-1 and 308-1 are comprised of optical systems which include prisms, beamsplitters, and reflectors adapted for use with millimeter and submillimeter wavelength radiation, or alternately, may be direct paths. The remainder of the circuitry of IC 306-1, then, operates in substantially the same manner as the circuitry of FIGS. 2A and 2B.

Figure 3C:
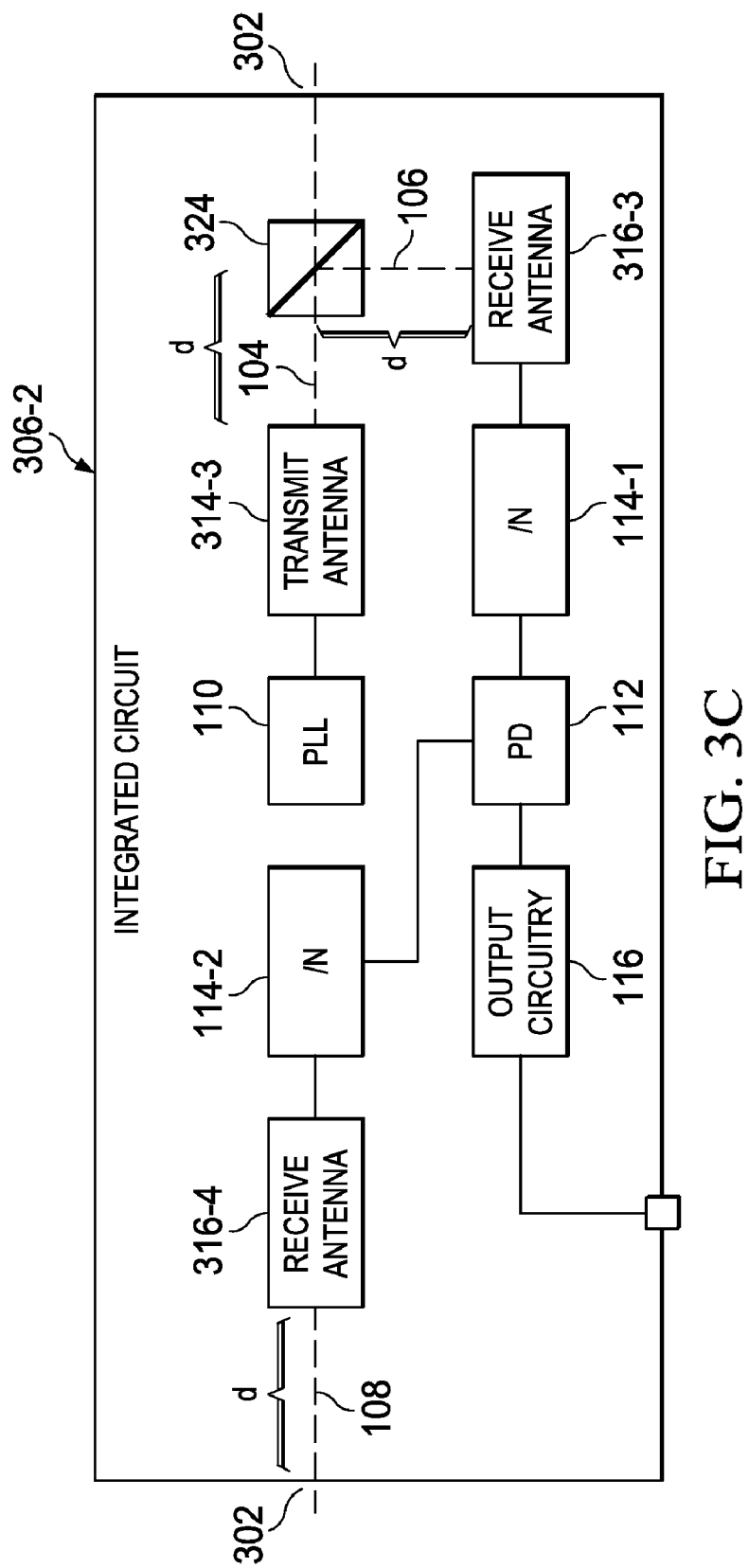

Looking to FIG. 3C, an example of IC 306 (denoted as reference numeral 306-2) that employs one beam or signal can be seen in greater detail. As shown, IC 306-2 generally uses the same or similar arrangement as shown in FIGS. 1A and 1B, namely, PLL 110, propagation path sections 104, 106, and 108, PD 114, dividers 114-1 and 114-2, and output circuitry 116. A difference, however, is that IC 306-2 employs TX antenna 314-3, RX antennas 316-3 and 316-3, and beamsplitter 324. In operation, the signal from TX antenna 314-3 traverses propagation path section 104 to beamsplitter 324 (which is generally comprised of a material, like silicon, that is partially reflective and partially transmissive to millimeter and submillimeter radiation). Part of this signal or beam is transmitted to RX antenna 316-3 across propagation path section 106, and part of this signal or beam is transmitted to the propagation path 302. The signal (after traversing path 302) can then be received by IC 306-2 so as to traverse propagation path section 108 to RX antenna 316-4. Thus, if the accelerometer 300 is at rest then the signals received by RX antennas 316-3 and 316-4 are substantially in phase. The remainder of the circuitry of IC 306-2, then, operates in substantially the same manner as the circuitry of FIGS. 1A and 1B.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a housing;
   a plurality of reflectors that are each secured to the housing, wherein the reflectors are substantially reflective to radiation having a wavelength that is less than 10 mm and greater than 100 μm, and wherein the reflectors are arranged to form a propagation path; and
   an integrated circuit (IC) that is secured to the housing and located in the propagation path, wherein the IC includes:
      a first antenna that is coupled to the propagation path;
      a second antenna that is coupled to the propagation path;
      a third antenna that is coupled to the propagation path;
      a fourth antenna that is coupled to the propagation path;
      an first oscillator that is coupled to the first antenna and applies a first signal to the propagation path traveling in a first direction, wherein the wavelength of the first signal is less than 10 mm and greater than 100 μm;
      an second oscillator that is coupled to the third antenna and applies a second signal to the propagation path traveling in a second direction, wherein the wavelength of the second signal is less than 10 mm and greater than 100 μm;
      a first PLL that is coupled to the second antenna and the first oscillator;
      a second PLL that is coupled to the fourth antenna and the second oscillator; and
      detection circuitry that is coupled to each of the first and second PLLs, wherein detection circuitry measures the phase difference between the first and second signals to determine physical movement.

2. The apparatus of claim 1, wherein the first and second PLLs are open loop and the received signals from the second and the forth antennas are provided to the detection circuitry.

3. The apparatus of claim 1, wherein the reflectors are comprised of a conductive material.

4. The apparatus of claim 3, wherein the reflectors are comprised of aluminum.

5. The apparatus of claim 1, wherein the detection circuitry further comprises:
   a first divider that is coupled to the first PLL;

a second divider that is coupled to the second PLL;

a phase detector that is coupled to each of the first and second dividers; and output circuitry that is coupled to the phase detector.

6. The apparatus of claim 1, wherein the propagation path is generally triangular in shape.

7. The apparatus of claim 1, wherein the IC further comprises:

a first coupler that optically couples the first and fourth antennas to the propagation path; and a second coupler that optically couples the second and third antennas to the propagation path.

8. The apparatus of claim 1, wherein the first and second signals have approximately the same wavelength, and wherein each of the first and second signals includes coding so as to reduce interference.

* * * * *